(12) United States Patent
Abugharbieh et al.

(10) Patent No.: US 6,275,117 B1
(45) Date of Patent: *Aug. 14, 2001

(54) CIRCUIT AND METHOD FOR CONTROLLING AN OUTPUT OF A RING OSCILLATOR

(75) Inventors: Khaldoon Abugharbieh, Sunnyvale; Sung-Ki Min, Cupertino, both of CA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/216,460

(22) Filed: Dec. 18, 1998

(51) Int. Cl.[7] ........................................... H03B 5/00
(52) U.S. Cl. ................ 331/57; 331/34; 327/276; 327/281; 323/313
(58) Field of Search ..................... 327/276, 158, 327/281; 331/57, 34; 323/313

(56) References Cited

U.S. PATENT DOCUMENTS

| | | | |
|---|---|---|---|
| 5,446,417 | * | 8/1995 | Korhonen et al. ............ 331/57 |
| 5,495,207 | * | 2/1996 | Novof ........................... 331/57 |
| 5,563,553 | * | 10/1996 | Jackson ......................... 331/57 |

* cited by examiner

Primary Examiner—Arnold Kinkead
(74) Attorney, Agent, or Firm—Christopher P. Malorana, P.C.

(57) ABSTRACT

A circuit and method configured to generate a variable impedance. The circuit may comprise a voltage controlled resistor configured to generate the variable impedance in response to (i) a first transistor configured to receive a first control signal and (ii) a bias transistor configured to receive a bias signal. In one example, the variable impedance may be generated in further response to a clamp transistor.

20 Claims, 4 Drawing Sheets

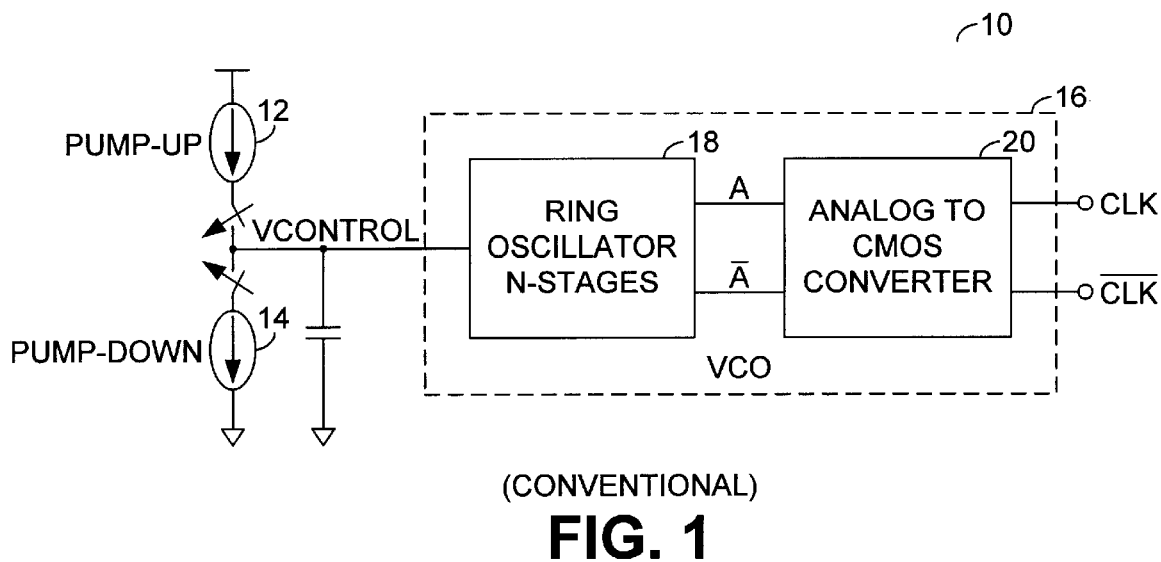
(CONVENTIONAL)
FIG. 1
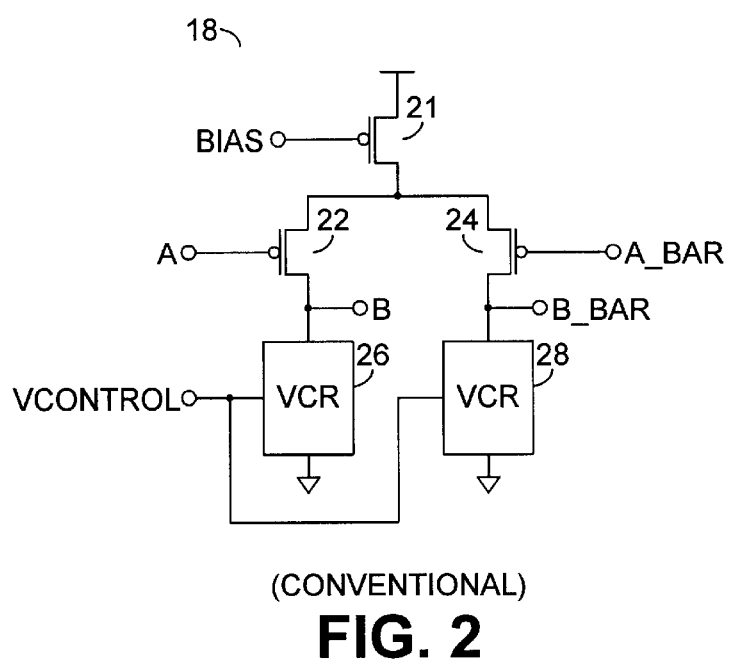
(CONVENTIONAL)
FIG. 2

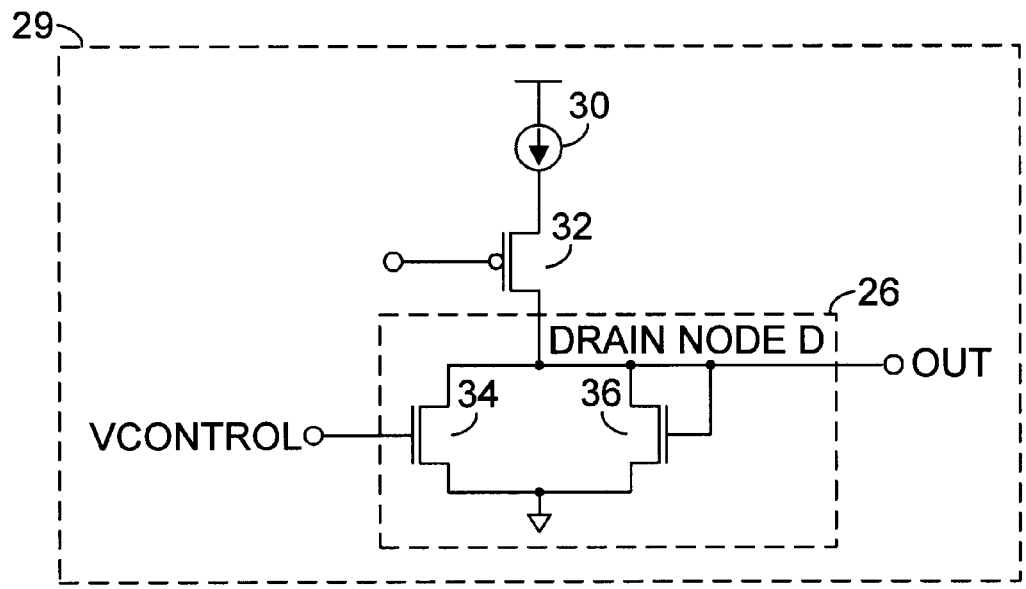
(CONVENTIONAL)
FIG. 3

CIRCUIT AND METHOD FOR CONTROLLING AN OUTPUT OF A RING OSCILLATOR

FIELD OF THE INVENTION

The present invention relates to voltage controlled oscillators (VCOs) generally and, more particularly, to a circuit and method for improving the analog swing of a ring oscillator.

BACKGROUND OF THE INVENTION

In a VCO, there is a ring oscillator that generates two differential analog signals that are presented to a comparator. The comparator converts the differential analog signals to CMOS levels. Referring to FIG. 1, a diagram of a circuit 10 is shown illustrating such a conventional VCO. The circuit 10 comprises a pump-up circuit 12, a pump-down circuit 14 and a VCO circuit 16. The VCO circuit 16 comprises a ring oscillator 18 and an analog-to-digital CMOS converter circuit 20. The signals A and Ab are converted to clock signals CLK and CLKb by the circuit 20.

Referring to FIG. 2, a more detailed diagram of a ring oscillator stage 18 is shown. The ring oscillator stage 18 comprises a transistor 21, a transistor 22, a transistor 24, a voltage controlled resistor (VCR) 26 and a VCR 28. The delay in the ring oscillator stage 18 is proportional to the capacitance and the impedance on nodes B and Bb. The ring oscillator 18 can have a number of stages (e.g., the number of stages can be N, 2N, 2N+1, etc.).

Referring to FIG. 3, a more detailed diagram of the conventional one leg of a ring oscillator stage 29 is shown. The leg 29 comprises a current source 30, a transistor 32, and a VCR 26 (or 28). The VCR comprises a transistor 34 and a transistor 36. When a control voltage (i.e., Vcontrol) presented to the transistor 34 is at a low voltage, the transistor 34 may be in a saturation mode. When the transistor 36 is cut off, the impedance at the drain node D will be very high, which can hinder proper and stable oscillation of the oscillator.

The voltage controlled resistor 26 controls the delay in each ring oscillator stage which, in turn, determines the frequency of oscillation of the output signal OUT. FIG. 3 illustrates a conventional approach where the VCR 26 consists of two transistors (i.e., transistor 34 and 36). As the control voltage Vcontrol increases, the impedance of the transistor 34 decreases, which reduces the delay in the particular stage and increases the frequency of oscillation of the VCO. The transistor 36 helps the oscillation at low control voltages when the transistor 34 is cut-off or at high control voltages when the transistor 34 is in saturation.

When the transistor 34 is in saturation and the transistor 36 is cut-off, the drain node D will see a high impedance. This may adversely affect oscillation and reduce the oscillation swing of the ring oscillator 18. Also, when the transistor 34 is cut-off, the node D will not properly oscillate, because it needs to be greater than the threshold voltage (i.e., VTNMOS) to turn on the transistor 36.

SUMMARY OF THE INVENTION

The present invention concerns a circuit and method configured to generate a variable impedance. The circuit may comprise a voltage controlled resistor configured to generate the variable impedance in response to (i) a first transistor configured to receive a first control signal and (ii) a bias transistor configured to receive a bias signal. In one example, the variable impedance may be generated in further response to a clamp transistor.

The objects, features and advantages of the present invention include providing a circuit a method for controlling an output of a ring oscillator stage that (i) improves the analog swing on the VCO, (ii) provides stable oscillation and (iii) reduces VCO gain variation.

BRIEF DESCRIPTION OF THE DRAWINGS

These and other objects, features and advantages of the present invention will be apparent from the following detailed description and the appended claims and drawings in which:

FIG. 1 is a block diagram of a conventional VCO;

FIG. 2 is a diagram of a conventional ring oscillator stage that may be used with the circuit of FIG. 1;

FIG. 3 is a circuit diagram of a conventional leg of a ring oscillator stage;

DETAILED DESCRIPTION OF THE PREFERRED EMBODIMENTS

Figure 4:
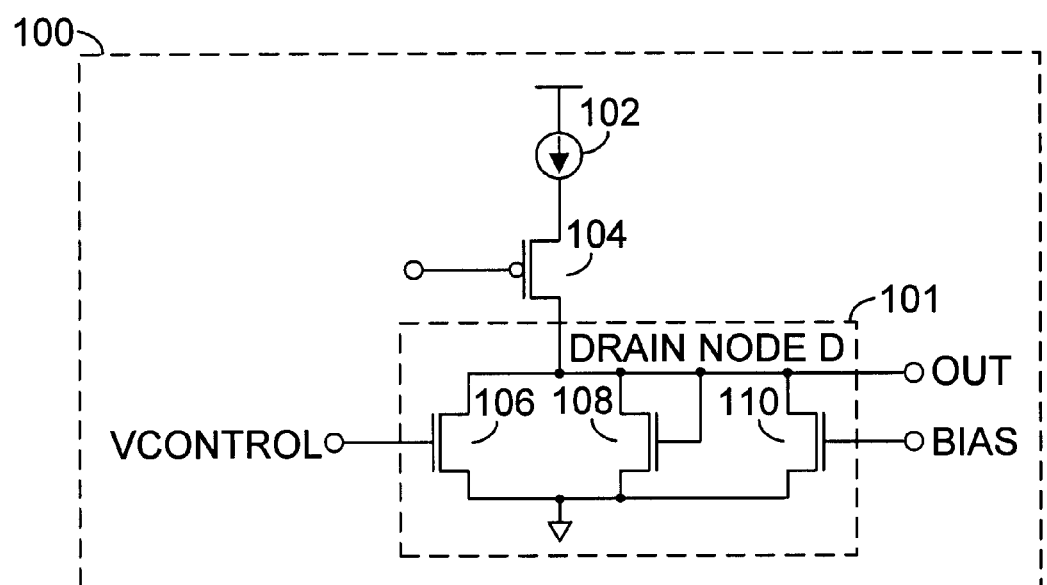
FIG. 4 is a circuit diagram of a ring oscillator stage in accordance with a preferred embodiment of the present invention.

Referring to FIG. 4, a circuit 100 is shown in accordance with a preferred embodiment of the present invention. The circuit 100 generally comprises a VCR 101, a current source 102 and a transistor 104. The VCR 101 generally comprises a transistor 106, a transistor 108 and a transistor 110.

The gate of the transistor 110 generally receives a control signal (e.g., BIAS). The signal BIAS may cause the transistor 110 to generally remain in a linear region. The transistor 110 may help to improve the overall impedance of the VCR when the transistor 106 is saturated and the transistor 108 is cut-off. Also, when the transistor 106 is cut-off, the transistor 110 will generally provide a low enough impedance for the drain node D to provide proper oscillation of the ring oscillator when the transistor 108 is cut-off. While the transistors 106, 108 and 110 are shown implemented using NMOS transistors, PMOS transistors may be substituted to meet the design criteria of a particular implementation.

The transistor 110 is generally a weak transistor compared to the transistors 106 and 108. For example, if the transistors 106 is sized as 8/2 and the transistor 108 is sized as 8/2 or 6/2 (i.e., having a channel width of 8 (or 6) $\mu$m (i.e., $10^{-6}$ m) and a channel length of 2 $\mu$m), then the transistor 110 may have, in one example, a channel width of 2 $\mu$m and a channel length of 20 $\mu$m. In one example, the transistor 110 may be 1% to 30% as strong as the transistor 106 and the transistor 108 may be 10%–150% as strong as the transistor 106. However, other strengths of the transistors 106, 108 and 110 may be implemented to meet the design criteria of a particular implementation. The bias provided by the transistor 110 may be such as it compensates for temperature and process variations. One example of a circuit that may generate the signal BIAS may be found in co-pending application U.S. Ser. No. 08/824,369, which is hereby incorporated by reference in its entirety. However, other circuits that generate bias signals that compensate for temperature and process variations may also be used.

The transistor 108 may be a clamp transistor that may control the voltage swing of the output of the ring oscillator (e.g., the ring oscillator 18). For example, the transistor 108 may control, or limit, the high end of the voltage of the ring oscillator.

Figure 5:
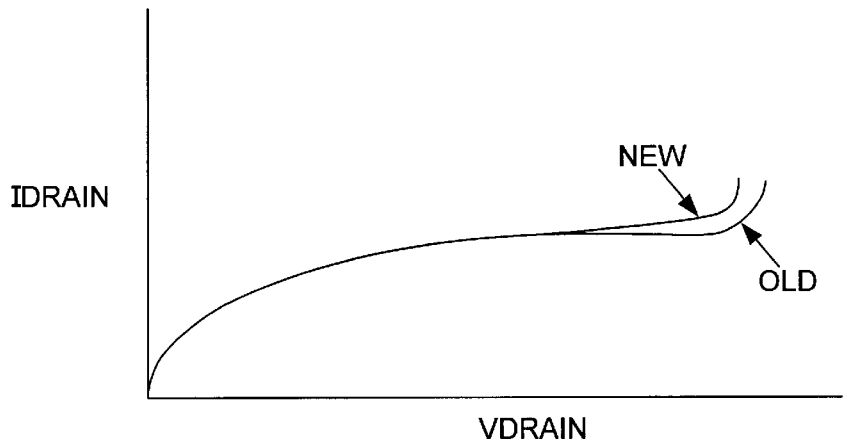
FIG. 5 is a general plot illustrating the drain voltage versus the drain current of the voltage controlled resistor of FIG. 4 compared to the voltage controlled resistor of FIG. 2.

Referring to FIG. 5, a plot of the drain voltage versus the drain current of the voltage controlled resistor of FIG. 4 (i.e., 26) compared to the voltage controlled resistor of FIG. 3 (i.e., 101) is shown. The plot circuit 101 is labeled as "NEW" and the plot of the circuit 26 is labeled as "OLD".

Figure 6:
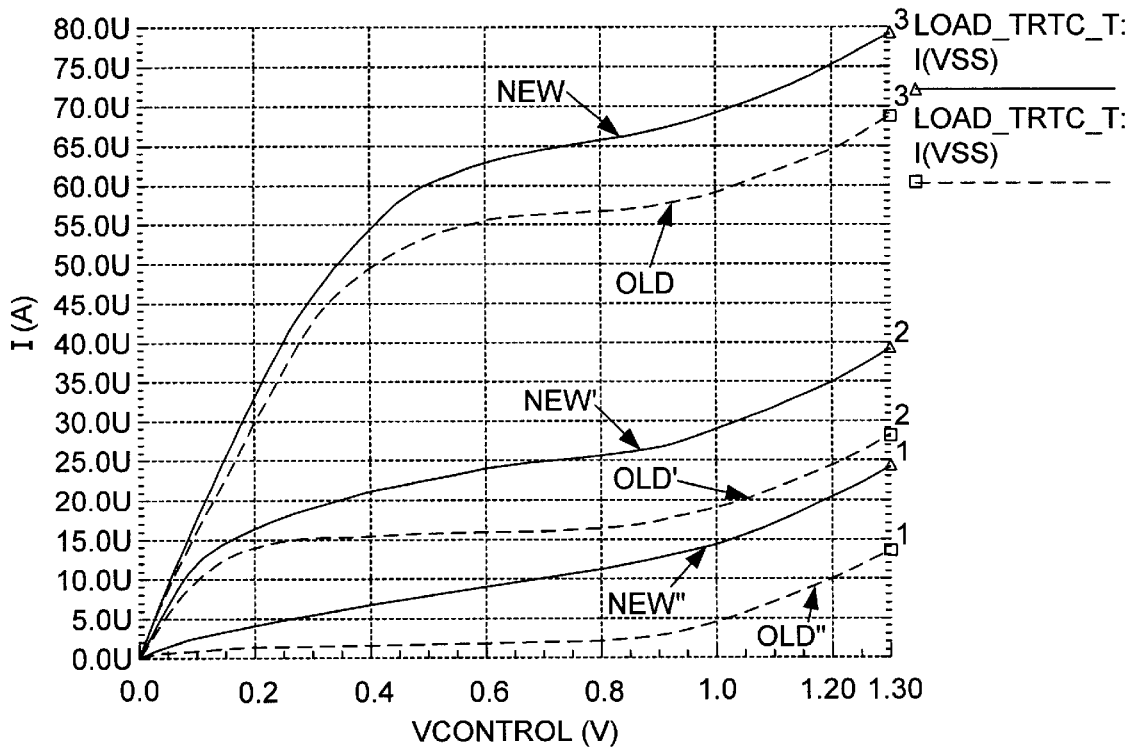
FIG. 6 is a more detailed plot of the voltage response of the circuit of FIG. 4 as compared to the circuit of FIG. 2.

Referring to FIG. 6, a more detailed plot illustrating a DC sweep of the node D for the circuit 101 versus the circuit 26 is shown. The signal Vcontrol is presented at 0.8 volts to generate the signal NEW and the signal OLD. The signal Vcontrol is generated at 1.2 volts to generate the plot of the signal NEW' and the signal OLD'. The signal Vcontrol is generated as 1.6 volts to generate the signal NEW" and the signal OLD". Each of the plots (i.e., NEW, NEW' and NEW") illustrates a current increase over the old circuit (i.e., OLD, OLD', OLD"). The current increase is present regardless of the increase in the output voltage.

Figure 7:
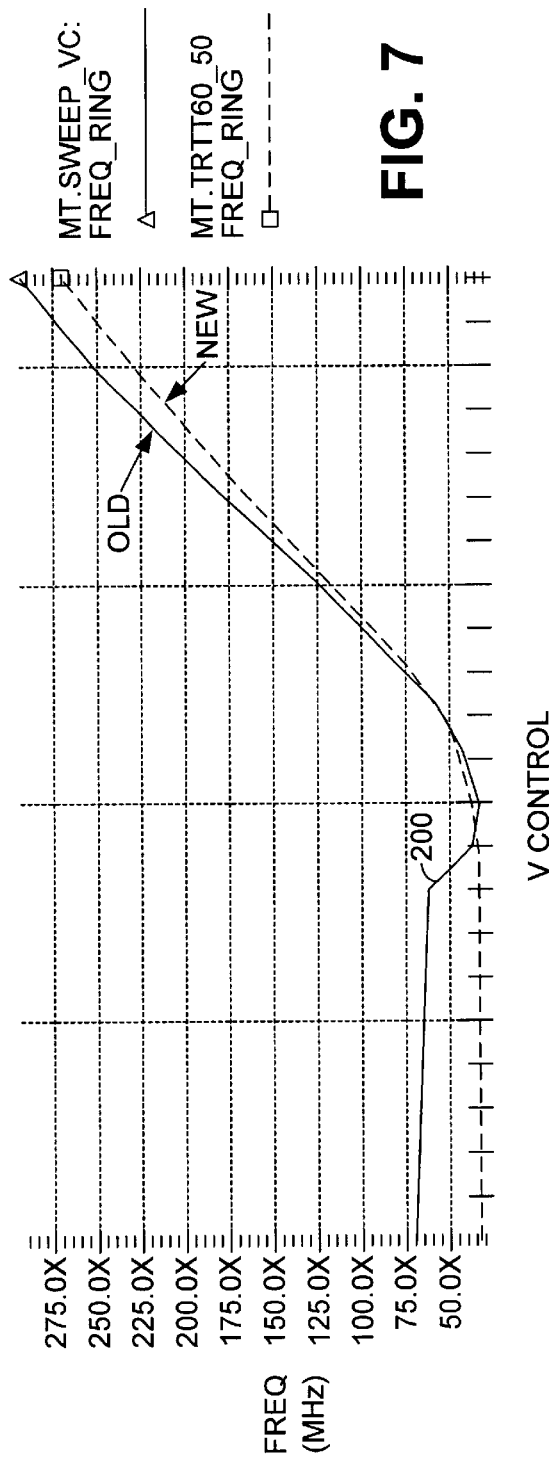
FIG. 7 is a plot of a resistor versus a no resistor comparison.

Referring to FIG. 7, a plot of the frequency versus voltage of the circuit 18 is shown implemented with the old VCRs (i.e., 26) and new VCRs (i.e., 101). The plot using the new VCR(s) 101 is shown as the plot NEW and the plot using the old VCR(s) 26 is shown as the plot OLD. The plot NEW does not exhibit the "dip" 200 as shown by the plot OLD.

Figure 8:
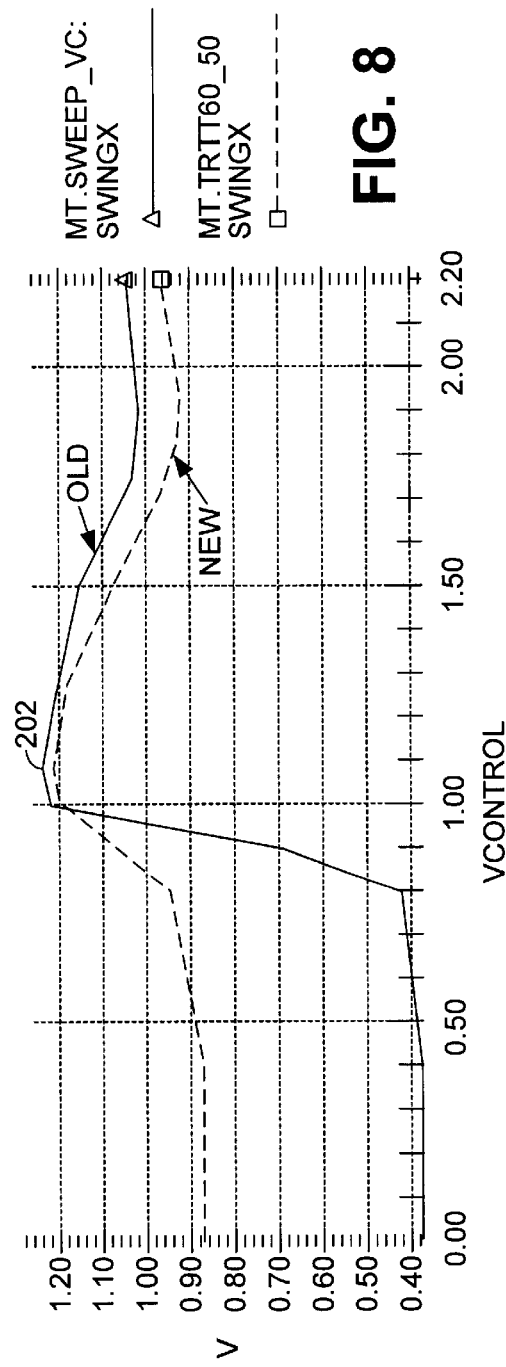
FIG. 8 is a plot of the analog swing versus voltage.

Referring to FIG. 8, a diagram illustrating the swing of the circuit 18 implemented with the old VCRs (i.e., 26) and new VCRs (i.e., 101). The plot using the new VCR(s) 101 is shown as the plot NEW and the plot of the old VCR(s) 26 is shown as the plot OLD. While the plot NEW exhibits a slight "bump" 202, the bump 202 is not as drastic as the bump in the plot OLD. Additionally, the plot NEW shows an improved swing compared to the plot OLD.

While the invention has been particularly shown and described with reference to the preferred embodiments thereof, it will be understood by those skilled in the art that various changes in form and details may be made without departing from the spirit and scope of the invention.

What is claimed is:

1. A circuit configured to generate a output signal having a frequency comprising:
  a voltage controlled resistor configured to generate a variable impedance in response to (i) a first transistor configured to receive a control signal and (ii) a bias transistor configured to receive a bias signal, wherein said bias signal causes said bias transistor to remain in a linear region and said bias transistor is weak compared to said first transistor and is configured to improve said variable impedance when said first transistor is saturated.

2. The circuit according to claim 1, wherein said variable impedance is generated in further response to a clamp transistor.

3. The circuit according to claim 1, further comprising:
  a ring oscillator configured to generate said output signal in further response to (i) a plurality of said voltage controlled resistors and (ii) an input signal.

4. The circuit according to claim 3, wherein said frequency of said output signal is proportional to a ratio of said plurality of voltage controlled resistors.

5. The circuit according to claim 3, further comprising:
  a pump-up circuit and a pump-down circuit configured to generate said input signal.

6. The circuit according to claim 2, wherein said output signal has a controlled swing in response to said clamp transistor.

7. A method configured to generate a variable impedance output signal comprising the steps of:
  (a) controlling a first device;
  (b) controlling a bias device, wherein said bias device is weaker than said first device; and
  (c) generating said variable impedance output signal in response to (i) a control signal and (ii) a bias signal, wherein step (c) comprises causing step (a) to remain in a linear region and step (b) to improve said variable impedance output signal when said first device is saturated.

8. The method according to claim 7, further comprising the step of:
  generating said output signal in further response to (i) a plurality of said variable impedances and (ii) an input signal.

9. The method according to claim 8, wherein said variable impedance output signal has a controlled swing in response to a clamping device.

10. The method according to claim 9, further comprising the step of:
  converting said output signal to a clock signal having a frequency.

11. The method according to claim 10, wherein a frequency of said clock signal is proportional to a ratio of said plurality of impedances.

12. A circuit configured to generate a variable impedance output signal comprising:
  a voltage controlled resistor configured to generate said variable impedance output signal in response to (i) a first transistor configured to receive a control signal, (ii) a bias transistor configured to receive a bias signal, wherein said bias transistor is weaker than said first transistor and (iii) a clamp transistor, wherein said bias signal causes said bias transistor to remain in a linear region and said bias transistor is configured to improve said variable impedance output signal when said first transistor is saturated and said clamp transistor is cut-off.

13. The circuit according to claim 2, wherein said bias transistor is further configured to improve said variable impedance when said clamp transistor is cut-off.

14. The circuit according to claim 2, wherein said bias transistor is further configured to provide a low impedance configured to provide proper oscillation of said output signal when said clamp transistor is cut-off.

15. The method according to claim 7, wherein step (c) further comprises improving said variable impedance when a clamp device is cut-off.

16. The method according to claim 7, wherein step (c) further comprises providing a low impedance to provide proper oscillation of said variable impedance output signal when a clamp device is cut-off.

17. The circuit according to claim 12, wherein said bias transistor is further configured to provide a low impedance configured to provide proper oscillation of said variable impedance output signal when said clamp transistor is cut-off.

18. The circuit according to claim 1, wherein said bias transistor is between 1% to 30% as strong as said first transistor.

19. A circuit configured to generate an output signal having a frequency comprising:

a voltage controlled resistor configured to generate a variable impedance in response to (i) a first transistor configured to receive a control signal and (ii) a bias transistor configured to receive a bias signal, wherein said bias signal causes said bias transistor to remain in a linear region and said bias transistor is between 1% to 30% as strong as said first transistor and is configured to improve said variable impedance when said first transistor is saturated.

20. An apparatus configured to generate an output signal having a frequency comprising:

means for generating a control signal;

means for generating a bias signal, wherein said bias signal generating means is weaker than said control signal generating means; and means for generating a variable impedance in response to (i) said control signal and (ii) said bias signal, wherein (i) said bias signal causes said control signal generating means to remain in a linear region and (ii) said bias signal generating means is weaker than said control signal generating means and is configured to improve said variable impedance when said control signal generating means is saturated.

* * * * *